(12) United States Patent
Hamidovic et al.

(10) Patent No.: US 11,570,033 B1
(45) Date of Patent: Jan. 31, 2023

(54) MULTIPHASE SIGNAL GENERATOR

(71) Applicant: Apple Inc., Cupertino, CA (US)

(72) Inventors: Damir Hamidovic, Linz (AT); Harald Pretl, Schwertberg (AT); Peter Leopold Preyler, Weyer (AT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/404,930

(22) Filed: Aug. 17, 2021

(51) Int. Cl.
*H04L 27/16* (2006.01)
*H04L 27/38* (2006.01)
*H04L 27/26* (2006.01)
*H04L 27/00* (2006.01)

(52) U.S. Cl.
CPC .......... *H04L 27/3863* (2013.01); *H04L 27/16* (2013.01); *H04L 27/2695* (2013.01); *H04L 2027/0057* (2013.01); *H04L 2027/0067* (2013.01)

(58) Field of Classification Search
CPC . H04L 27/16; H04L 27/2695; H04L 27/3863; H04L 2027/0057; H04L 2027/0067
See application file for complete search history.

(56) References Cited

U.S. PATENT DOCUMENTS

| 7,907,661 B2* | 3/2011 | Provost | H04B 3/462 |
| | | | 370/231 |
| 10,659,710 B2* | 5/2020 | Saeki | H03L 7/08 |
| 2002/0053931 A1 | 5/2002 | Yamaguchi | |
| 2012/0286838 A1* | 11/2012 | Hsu | H03H 11/265 |
| | | | 327/231 |
| 2017/0359164 A1* | 12/2017 | Vlachogiannatos | H04L 7/0037 |
| 2017/0366242 A1* | 12/2017 | Lee | H04B 7/0482 |
| 2018/0367153 A1* | 12/2018 | Ek | H03L 7/0996 |
| 2021/0281253 A1* | 9/2021 | Kalcher | H03B 19/14 |

OTHER PUBLICATIONS

Michael Kalcher, 1-3-GHz Self-Aligned Open-Loop Local Quadrature Phase Generator With Phase Error Below 0.4, IEEE Transactions On Microwave Theory and Techniques, vol. 68, No. 8, Aug. 2020.
Michael Kalcher, Self-Aligned Open-Loop Multiphase Generator, 2019 IEEE International Symposium on Circuits and Systems (ISCAS), 2019, pp. 1-5.
Extended European Search Report for European Patent No. 22177807 dated Dec. 6, 2022; 9 pgs.

* cited by examiner

*Primary Examiner* — Siu M Lee
(74) *Attorney, Agent, or Firm* — Fletcher Yoder, P.C.

(57) ABSTRACT

Multiphase signal generation circuitry receives input signals that are out-of-phase with one another by a quadrature delay (e.g., 90°), and generates output signals that are out-of-phase with one another by half of the quadrature delay. A first input signal may be provided to a first delay circuitry, which is then input to a first phase interpolator. The first delay circuitry is also input to second delay circuitry, which also generates an output that is input to the first phase interpolator. The first phase interpolator outputs a first output signal. The second delay circuitry is input to third delay circuitry, which in turn is input to a second phase interpolator with a second input signal that is out-of-phase with the first input signal by the quadrature delay. The second phase interpolator outputs a second output signal that is out-of-phase with the first output signal by the half of the quadrature delay.

21 Claims, 8 Drawing Sheets

MULTIPHASE SIGNAL GENERATOR

BACKGROUND

The present disclosure relates generally to wireless communication, and more specifically to signal modulation.

In a wireless communication device, a transceiver may use quadrature amplitude modulation to transmit and receive data. To do so, the transceiver may generate multiple phases of a local oscillator signal (e.g., having in-phase and quadrature components). However, generating these phases of the local oscillator signal may result in excessive noise and/or power consumption.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, phase generation circuitry includes a first phase interpolator that receives a first input signal that is delayed by first delay circuitry, receives the first input signal that is delayed by the first delay circuitry and second delay circuitry, and outputs a first output signal. The phase generation circuitry also includes a second phase interpolator that receives the first input signal that is delayed by the first delay circuitry, the second delay circuitry, and third delay circuitry, receives a second input signal with a phase difference of a quadrature delay compared to the first input signal, and outputs a second output signal. The first output signal and the second output signal have a phase difference of half of the quadrature delay.

In another embodiment, multiphase generation circuitry includes a first portion having first delay circuitry coupled to second delay circuitry coupled to third delay circuitry, a first interpolator coupled to the first delay circuitry and the second delay circuitry, and a second interpolator coupled to the third delay circuitry. The multiphase generation circuitry also includes a second portion having fourth delay circuitry coupled to fifth delay circuitry coupled to sixth delay circuitry, a third interpolator coupled to the fourth delay circuitry and the fifth delay circuitry, and a fourth interpolator coupled to the sixth delay circuitry, the second interpolator of the first portion coupled to the second portion. The multiphase generation circuitry further includes a third portion having seventh delay circuitry coupled to eighth delay circuitry coupled to ninth delay circuitry, a fifth interpolator coupled to the seventh delay circuitry and the eighth delay circuitry, and a sixth interpolator coupled to the ninth delay circuitry, the fourth interpolator of the second portion coupled to the third portion. The multiphase generation circuitry also includes a fourth portion having tenth delay circuitry coupled to eleventh delay circuitry coupled to twelfth delay circuitry, a seventh interpolator coupled to the tenth delay circuitry and the eleventh delay circuitry, and an eighth interpolator coupled to the twelfth delay circuitry, the sixth interpolator of the third portion coupled to the fourth portion.

In yet another embodiment, an electronic device includes one or more antennas and a transceiver communicatively coupled to the one or more antennas. The transceiver has multiphase generation circuitry having first delay circuitry coupled to second delay circuitry coupled to third delay circuitry, first phase interpolation circuitry coupled to the first delay circuitry and the second delay circuitry, and second phase interpolation circuitry coupled to the third delay circuitry. The first phase interpolation circuitry generates a first output signal, and the second phase interpolation circuitry generates a second output signal. The first output signal and the second output signal have a phase difference of half of a quadrature delay.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
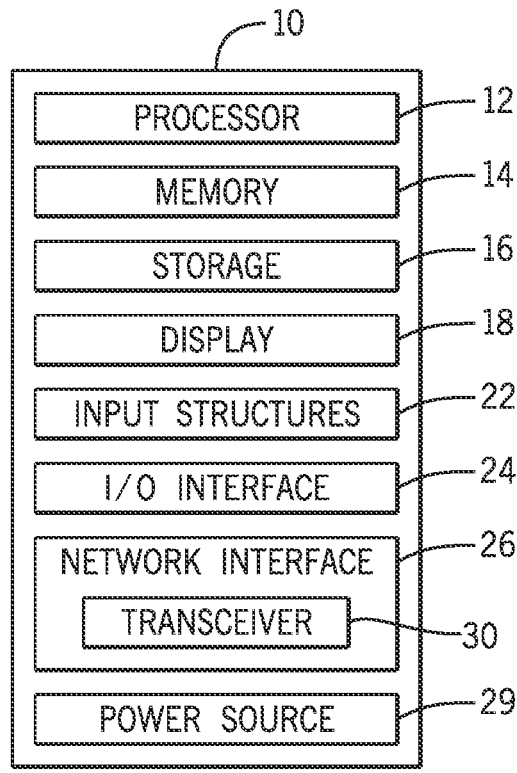
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to generating multiple phases of local oscillator signals (e.g., having in-phase and quadrature components). To communicate using a 4th generation (4G) communication standard (e.g., the long term evolution (LTE®) standard) and/or a 5th generation (5G) communication standard (e.g., the New Radio (NR) standard), a transceiver of a communication device may use quadrature amplitude modulation, which may use multiple phases of local oscillator signals. For example, the transceiver may generate eight phases of a local oscillator signal (e.g., shifted or out-phased by 45° or half of a quadrature delay of 90°). That is, the transceiver may generate the local oscillator signal itself (with a phase of 0°), the local oscillator signal shifted or out-phased by 45°, the local oscillator signal shifted or out-phased by 90°, the local oscillator signal shifted or out-phased by 135°, the local oscillator signal shifted or out-phased by 180°, the local oscillator signal shifted or out-phased by 225°, the local oscillator signal shifted or out-phased by 270°, and/or the local oscillator signal shifted or out-phased by 315°. However, generating these phases of the local oscillator signal may result in excessive noise and/or power consumption.

For example, using ring oscillators to generate these phases of a local oscillator signal results in excessive phase noise, which may not be suitable for cellular applications. Using dividers to divide an input local oscillator signal into the multiple phases may result in excessive frequency of the input local oscillator signal, which may draw excessive power. Using the eight-phase output as an example, if a wanted frequency of the out-phased output signals is 6 gigahertz (GHz), then a frequency of the input local oscillator signal needs to be four times the output frequency, which is 24 GHz. While delay-locked loops are used to generate the output signals, the delay-locked loops may include long arrays of delay circuitries, which may lead to excessive jitter and/or phase noise.

Embodiments herein provide multiphase signal generation circuitry that receives input signals that are out-of-phase with one another by 90°, and generates output signals that are 45° out-of-phase with one another. In particular, the circuitry may be open-loop, such that the output signal may not be fed back as an input to the circuitry (as in a closed-loop or feedback circuit). Moreover, the circuitry may avoid using ring oscillators, dividers, and delay-locked loop circuitry, and instead use (e.g., only use) delay circuitries and phase interpolators. The circuitry may be of particular use in providing multiple phases of local oscillator signals. For example, the circuitry may receive as inputs an in-phase or 'I' component of a local oscillator signal and a quadrature or 'Q' component of the local oscillator signal (that is offset from the I component by a quadrature delay of 90°), and generate output signals that are out-of-phase with one another by half of the quadrature delay or 45°. Advantageously, the output signals may have the same frequency as the input signals (e.g., the I and Q component signals). In particular, the phase generation circuitry may include three delay circuitries and two phase interpolators. A first input signal (e.g., the I component) may be provided to first delay circuitry (e.g., that causes a delay of $\Delta x$), which is then input to a first phase interpolator. The first delay circuitry is also input to second delay circuitry (e.g., that causes a delay of $\Delta\vartheta$) which generates an output that is input to the first phase interpolator. The first phase interpolator outputs a first output signal (e.g., having a phase of $\psi_1$). The second delay circuitry is input to third delay circuitry (e.g., that also causes a delay of $\Delta x$), which in turn is input to a second phase interpolator with a second input signal (e.g., the Q component). The second phase interpolator outputs a second output signal having a phase of $\psi_2$. The second output signal $\psi_2$ and the first output signal $\psi_1$ may be out-of-phase by half of the quadrature delay (e.g., 45°).

The phase generation circuitry may also include two additional delay circuitries and an additional phase interpolator to generate an output signal that out-of-phase with the first output signal $\psi_1$ by the quadrature delay. The second input signal (e.g., the Q component) may be provided to fourth delay circuitry (e.g., that causes a delay of $\Delta x$), which is then input to a third phase interpolator. The fourth delay circuitry is also input to fifth delay circuitry (e.g., that causes a delay of $\Delta\vartheta$) which generates an output that is input to the third phase interpolator. The third phase interpolator outputs a third output signal (e.g., having a phase of $\psi_3$). The third output signal $\psi_3$ and the first output signal $\psi_1$ may be out-of-phase by the quadrature delay.

The phase generation circuitry may also include an additional delay circuitry and an additional phase interpolator to generate an output signal that is out-of-phase with the first output signal $\psi_1$ by one and a half times the quadrature delay (e.g., 135°). The fifth delay circuitry may be input to sixth delay circuitry (e.g., that causes a delay of $\Delta x$), which is then input to a fourth phase interpolator. A third input signal that is out-of-phase with the first input signal by twice the quadrature delay (e.g., an inverted I or component that is offset from the I component by 180°) may also be provided to the fourth phase interpolator, which outputs a fourth output signal (e.g., having a phase of $\psi_4$). The fourth output signal $\psi_4$ and the first output signal $\psi_1$ may be out-of-phase by one and a half times the quadrature delay (e.g., 135°).

The phase generation circuitry may further include two additional delay circuitries and an additional phase interpolator to generate an output signal that is out-of-phase with the first output signal $\psi_1$ by twice the quadrature delay (e.g., 180°). The third input signal (e.g., the I component) may be provided to seventh delay circuitry (e.g., that causes a delay of $\Delta x$), which is then input to a fifth phase interpolator. The seventh delay circuitry is also input to eighth delay circuitry (e.g., that causes a delay of $\Delta \vartheta$), which generates an output that is input to the fifth phase interpolator. The fifth phase interpolator outputs a fifth output signal (e.g., having a phase of $\psi_5$). The fifth output signal $\psi_5$ and the first output signal $\psi_1$ may be out-of-phase by twice the quadrature delay (e.g., 180°).

The phase generation circuitry may also include an additional delay circuitry and an additional phase interpolator to generate an output signal that is out-of-phase with the first output signal $\psi_1$ by 2.5 times the quadrature delay (e.g., 225°). The eighth delay circuitry may be input to ninth delay circuitry (e.g., that causes a delay of $\Delta x$), which is then input to a sixth phase interpolator. A fourth input signal that is out-of-phase with the first input signal by three times the quadrature delay (e.g., an inverted Q or '$\overline{Q}$' component that is offset from the I component by 270°) may also be provided to the sixth phase interpolator, which outputs a sixth output signal (e.g., having a phase of $\psi_6$). The sixth output signal $\psi_6$ and the first output signal $\psi_1$ may be out-of-phase by 2.5 times the quadrature delay (e.g., 225°).

The phase generation circuitry may further include two additional delay circuitries and an additional phase interpolator to generate an output signal that is out-of-phase with the first output signal $\psi_1$ by three times the quadrature delay (e.g., 270°). The fourth input signal (e.g., the $\overline{Q}$ component) may be provided to tenth delay circuitry (e.g., that causes a delay of $\Delta x$), which is then input to a seventh phase interpolator. The tenth delay circuitry is also input to eleventh delay circuitry (e.g., that causes a delay of which generates an output that is input to the seventh phase interpolator. The seventh phase interpolator outputs a seventh output signal (e.g., having a phase of $\psi_7$). The seventh output signal $\psi_7$ and the first output signal $\psi_1$ may be out-of-phase by three times the quadrature delay (e.g., 270°).

The phase generation circuitry may also include an additional delay circuitry and an additional phase interpolator to generate an output signal that is out-of-phase with the first output signal $\psi_1$ by 3.5 times the quadrature delay (e.g., 315°). The eleventh delay circuitry may be input to twelfth delay circuitry (e.g., that causes a delay of $\Delta x$), which is then input to an eighth phase interpolator. The first input signal (e.g., the I component) may also be provided to the eighth phase interpolator, which outputs an eighth output signal (e.g., having a phase of $\psi_8$). The eighth output signal $\psi_8$ and the first output signal $\psi_1$ may be out-of-phase by 3.5 times the quadrature delay (e.g., 315°).

In this manner, the phase generation circuitry may generate output signals that are out-of-phase with one another by 45° half of the quadrature delay (e.g., for an entire 360° range). Advantageously, the frequency of the output signals may be the same as the frequency of the input signals, as opposed to divided-based circuitry which may result in increasing the frequency of the input signals (e.g., up to four times for the case where output signals have eight phases). As such, the circuitry avoids the need to synchronize the output signals with the input signals. Moreover, the delay circuitries may apply "coarse," arbitrary delays that may not need to be accurately tuned, such that devices having the circuitry may tolerate variations of the delay circuitries. Furthermore, variations in delay caused by environment factors, such as supply voltage or temperature changes, may be tolerated as well. Because the circuitry is open-loop, the increased complexity, power consumption, and instability of closed-loop or feedback circuitry may be avoided.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, Calif.), a portable electronic or handheld electronic device such as a wireless electronic device or smartphone (e.g., in the form of a model of an iPhone® available from Apple Inc. of Cupertino, Calif.), a tablet (e.g., in the form of a model of an iPad® available from Apple Inc. of Cupertino, Calif.), a wearable electronic device (e.g., in the form of an Apple Watch® by Apple Inc. of Cupertino, Calif.), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies. It should be understood that, in some embodiments, the electronic device 10 may not have a display 18, such as in the case of the electronic device 10 being a server, router, communication hub, and so on.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, Calif., a universal serial bus (USB), or other similar connector and protocol. The network interface 26 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
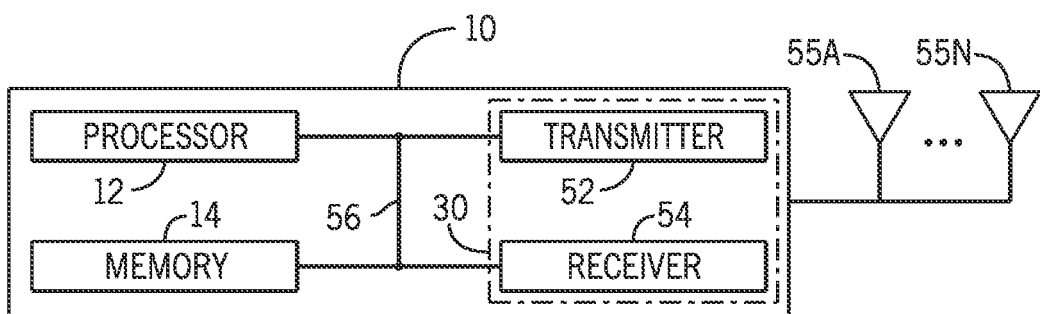
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
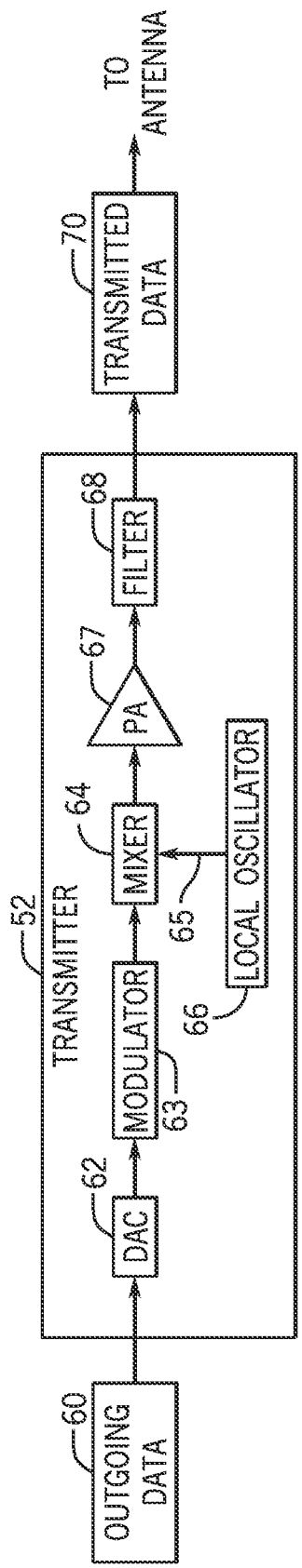
FIG. 3 is a schematic diagram of a transmitter of the electronic device of FIG. 1, according to embodiments of the present disclosure.

As mentioned above, the transceiver 30 of the electronic device 10 may include a transmitter and a receiver that are coupled to at least one antenna to enable the electronic device 10 to transmit and receive wireless signals. FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 (which may include quadrature component signals) from a local oscillator 66 to generate a radio frequency signal. A power amplifier (PA) 67 receives the radio frequency signal from the mixer 64, and may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 68 if the power amplifier 67 outputs the amplified signal in or approximately in a desired frequency range (such that filtering of the amplified signal may be unnecessary).

Figure 4:
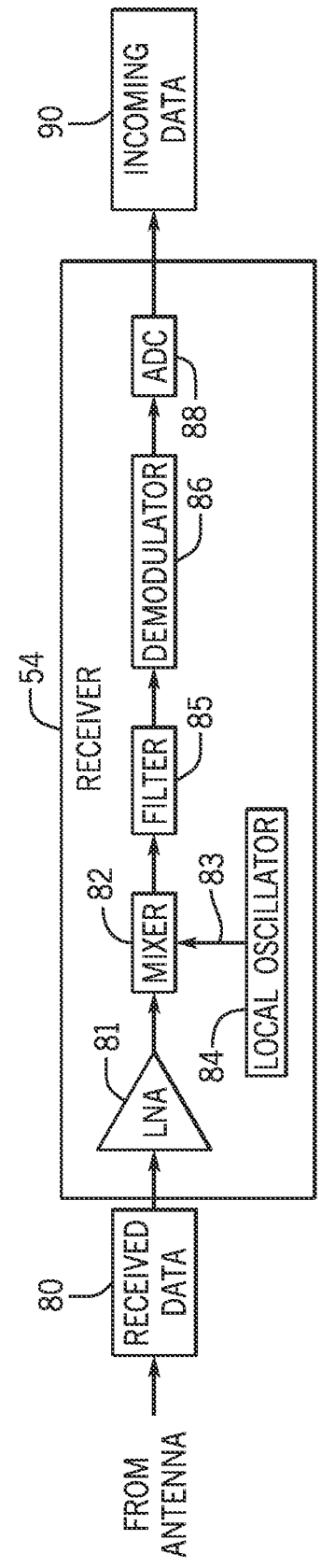
FIG. 4 is a schematic diagram of a receiver of the electronic device of FIG. 1, according to y embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillator signal 83 (which may include quadrature component signals) from a local oscillator 84 to generate an intermediate or baseband frequency signal. A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Embodiments herein provide multiphase signal generation circuitry that receives input signals that are out-of-phase with one another by 90°, and generates output signals that are 45° out-of-phase with one another. In particular, the circuitry may be open-loop, such that the output signal may not be fed back as an input to the circuitry (as in a closed-loop or feedback circuit). Moreover, the circuitry may avoid using ring oscillators, dividers, and delay-locked loop circuitry, and instead use (e.g., only use) delay circuitries and phase interpolators. The circuitry may be of particular use in providing multiple phases of local oscillator signals. The multiphase signal generation circuitry may be included in the transceiver 30, and in particular in the local oscillator 66 of the transmitter 52 and/or the local oscillator 84 of the receiver 54. Moreover, while the multiphase signal generation circuitry is illustrated as part of the local oscillator 66, it should be understood that the multiphase signal generation circuitry may be included in any suitable application or circuitry, such as analog or mixed circuitry including time-interleaved data converters, N-path filters, multiphase mixers, power amplifiers, and so on. Additionally, while FIGS. 3 and 4 represent an analog-intensive transmitter 52 and receiver 54 respectively, the multiphase signal generation circuitry may be included in any suitable digital circuitry, such as high-speed serial link applications, clock/local oscillator multiplication circuits, microprocessor timing circuitry, and so on.

Figure 5:
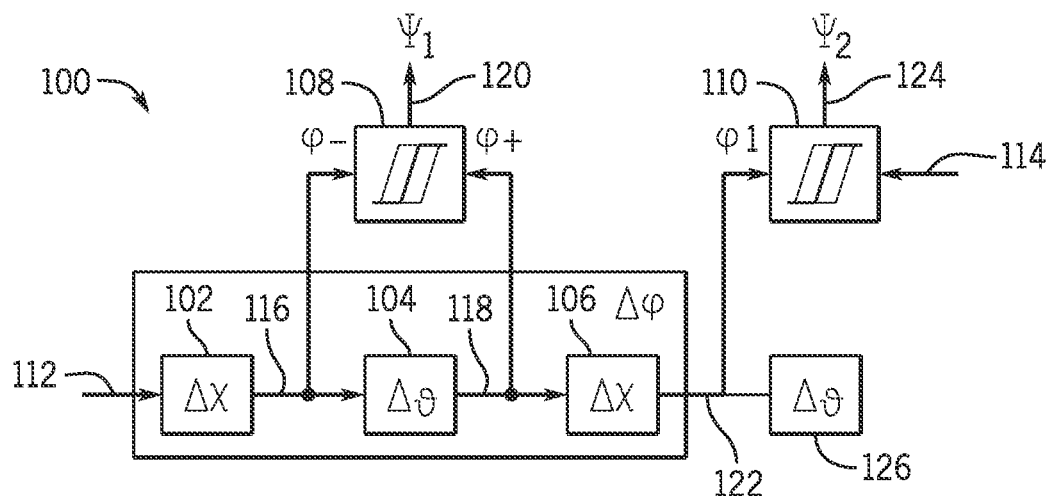
FIG. 5 is a schematic diagram of multiphase signal generation circuitry that may be a part of the transmitter of FIG. 3 and/or the receiver of FIG. 4, receives input signals that are out-of-phase with one another by a quadrature delay, and generates output signals that are out-of-phase with one another by half of the quadrature delay, according to embodiments of the present disclosure.

FIG. 5 is a schematic diagram of multiphase signal generation circuitry 100 that may be a part of a local oscillator (e.g., 66, 84) of the transmitter 52 and/or the receiver 54, receives input signals that are out-of-phase with one another by a quadrature delay of 90°, and generates output signals that are out-of-phase with one another by half of the quadrature delay (e.g., 45°), according to embodiments of the present disclosure. As illustrated, the multiphase signal generation circuitry 100 may include three delay circuitries 102, 104, 106 and two phase interpolators 108, 110. The delay circuitries 102, 106 may include any suitable delay circuitry or element that causes a delay of $\Delta x$, while the delay circuitry 104 may include any suitable delay circuitry that causes a different delay $\Delta \vartheta$. The delays $\Delta x$, $\Delta \vartheta$ cause by the delay circuitries 102, 104, 106 may be "coarse," such that they are not accurately tuned to a desired delay. In particular, $\Delta x$ may include any suitable delay less than half of the quadrature delay or 45° (e.g., less than 35°, less than 25°, less than 15°, less than 5°, and so on). $\Delta \vartheta$ may each include any suitable delay less than the quadrature delay of 90° (e.g., less than 80°, less than 60°, less than 30°, less than 10°, and so on). In some embodiments, $\Delta x$ may be a nonzero delay, and $\Delta \vartheta$ may be a 0° delay (or the corresponding delay elements providing the $\Delta \vartheta$ may be omitted from the multiphase signal generation circuitry 100 altogether). In some embodiments, the delays $\Delta x$ are different from the delays $\Delta \vartheta$, though in other embodiments, the delays $\Delta x$ may be equal to the delays $\Delta \vartheta$. In any case, all delays $\Delta x$ are approximately equal to each other (e.g., to ensure consistent performance), and all delays $\Delta \vartheta$ are approximately equal to each other (e.g., to ensure consistent performance). Advantageously, because the delays $\Delta x$, $\Delta \vartheta$ need not be accurately tuned, the electronic device 10 may tolerate variations of the delay circuitries 102, 104, 106. Furthermore, variations in delay caused by environment factors, such as supply voltage or temperature changes, may be tolerated as well, since the $\Delta x$ delays may vary by the same amount, and the $\Delta \vartheta$ delays may vary by the same amount. That is, time, money, and effort need not be spent tuning the delay circuitries 102, 104, 106 to generate specific delays, only that the delays Δx are approximately equal to each other, and that the delays Δϑ are approximately equal to each other.

The phase interpolators 108, 110 may include any suitable phase interpolation circuitry that interpolates between two input signals in the phase domain, such as voltage-mode phase interpolators. That is, the phase interpolators 108, 110 may each perform interpolation (e.g., a divide-by-two operation) to determine an output signal having a phase in-between the two input signals, or dividing a phase difference between the two input signals in half. In some embodiments, the delays Δx, are selected such that phase interpolators 108, 110 perform interpolation between input signals in a linear region of the phase interpolators 108, 110. The linear region may be dependent on the two input signals, and occur where transitions of the signals within phase interpolators, triggered by two input signals (e.g., between low and high values, or vice versa) overlap.

The multiphase signal generation circuitry 100 may receive two input signals 112, 114 that are 90° out-of-phase with one another. For example, a first input signal 112 may include an in-phase or 'I' component of a local oscillator signal (e.g., 65, 83) and the second input signal 114 may include a quadrature or 'Q' component of the local oscillator signal. Thus, the delay (e.g., a phase delay of 90°) between the I and Q components of the signals may be referred to herein as a "quadrature delay." In particular, the transceiver 30 may distribute the local oscillator signal differentially, which may enable the transceiver 30 to conveniently provide the I component, an inverted 'I' or component that is offset from the I component by twice the quadrature delay or 180°, the Q component, and an inverted Q or 'Q̄' component that is offset from the Q component by twice the quadrature delay or 180° to the multiphase signal generation circuitry 100. Direct-phase interpolators may be unable to linearly interpolate these local oscillator component signals (e.g., I, Ī, Q, Q̄) since the signals within phase interpolators, triggered by two input signals to such phase interpolators may require overlapping transitions. The disclosed embodiments may use additional phase shifts to generate auxiliary (e.g., separated by half of the quadrature delay or 45°) phases, enabling linear phase interpolation of the local oscillator component signals. In some embodiments, the local oscillator component signals may be generated by any suitable I/Q local oscillator generator (e.g., a divider-based generator, an open-loop-based generator similar to that disclosed herein that generates phase differences of the quadrature delay of 90°, and so on.)

As illustrated, the first input signal 112 is input to first delay circuitry 102, which provides a first signal 116 (e.g., having a phase φ−) to a first phase interpolator 108. The output 116 of the first delay circuitry 102 is input to second delay circuitry 104, which provides a second signal 118 (e.g., having a phase φ+) to the first phase interpolator 108. The first phase interpolator 108 interpolates between the phases φ− and φ+ to generate a first output signal 120 (e.g., having a phase ψ₁ that is halfway between φ− and φ+). The output 118 of the second delay circuitry 104 is input to the third delay circuitry 106, which provides a first signal 122 (e.g., having a phase φ₁) to a second phase interpolator 110. As illustrated, the total phase delay between the first input signal 112 and the first signal 122 is Δφ (e.g., Δx+Δϑ+Δx). The second phase interpolator 110 also receives as the second input signal 114, which is out-of-phase with the first input signal 112 by the quadrature delay of 90°. The second phase interpolator 110 then interpolates between the phases φ₁ and that of the second input signal 114 to generate a second output signal 124 (e.g., having a phase ψ₂ that is halfway between φ₁ and that of the second input signal 114). The phases of the first output signal 120 (e.g., ψ₁) and the second output signal 124 (e.g., ψ₂) are out-of-phase by half of the quadrature delay or 45°. In some embodiments, the multiphase signal generation circuitry 100 may include a dummy load 126 having a delay of Δϑ. The dummy load 126 may facilitate providing a balanced load in the multiphase signal generation circuitry 100 for better performance.

Figure 6:
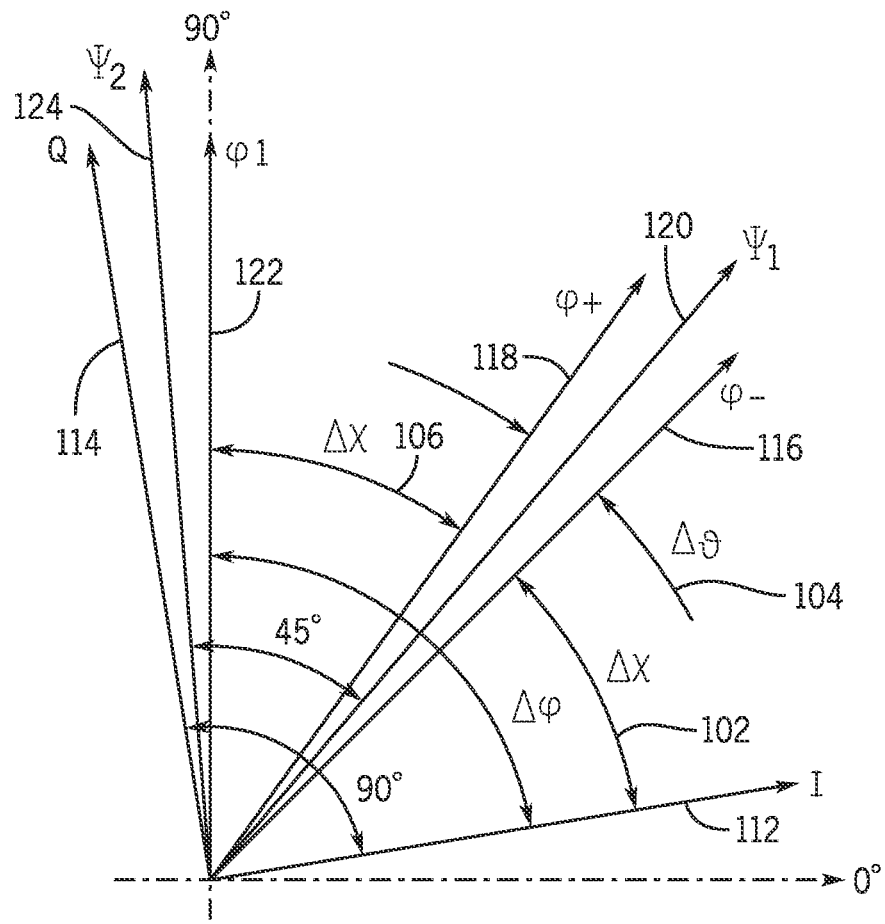
FIG. 6 is a phase plot illustrating the phases associated with and output by the multiphase signal generation circuitry of FIG. 5, according to embodiments of the present disclosure.

FIG. 6 is a phase plot illustrating the phases associated with and output by the multiphase signal generation circuitry 100 of FIG. 5, according to embodiments of the present disclosure. The phase plot may include a horizontal axis representing 0° and a vertical axis representing 90°. As illustrated, the first input signal 112 may include an I component signal of a local oscillator signal (e.g., 65, 83), and the second input signal 114 may include a Q component signal of the local oscillator signal. As such, the second input signal 114 may be out-of-phase from the first input signal 112 by the quadrature delay of 90°.

As explained with respect to FIG. 5, the first signal 116 input to the first phase interpolator 108 may have a phase of φ− due to being delayed by Δx from the first delay circuitry 102. The second signal 118 input to the first phase interpolator 108 may have a phase of φ+ due to being delayed by Δx from the first delay circuitry 102 and by from the second delay circuitry 104. The first phase interpolator 108 interpolates between the phases φ− and φ+ to generate a first output signal 120 having the phase ψ₁ that is halfway between φ− and φ+. As such, the phase ψ₁ may be expressed by Equation 1 below:

$$\psi_1 = I + \Delta x + \frac{\Delta \vartheta}{2} \quad \text{(Equation 1)}$$

Also as explained in FIG. 5, the first signal 122 input to the second phase interpolator 110 may have a phase of φ₁ due to being delayed by Δx from the first delay circuitry 102, Δϑ from the second delay circuitry 104, and Δx from the third delay circuitry 106. The second signal 114 input to the second phase interpolator 110 (e.g., the Q component signal of the local oscillator signal) may have a phase that is out-of-phase with the first input signal 112 (e.g., the I component signal of the local oscillator signal) by the quadrature delay of 90°. The second phase interpolator 110 interpolates between the phases φ₁ and that of the second input signal 114 to generate a second output signal 124 having the phase ψ₂ that is halfway between φ₁ and that of the second input signal 114. As such, the phase ψ₂ may be expressed by Equation 2 below:

$$\psi_2 = \frac{Q + \varphi_1}{2} = \quad \text{(Equation 2)}$$
$$\frac{I + 90^\circ + I + 2\Delta x + \Delta \vartheta}{2} = I + \Delta x + \frac{\Delta \vartheta}{2} + 45^\circ = \psi_1 + 45^\circ$$

It should be noted that a delay mismatch between delay circuitries providing the same delay amount (e.g., Δx or Δϑ) may be included in any of the Equations provided above or below (e.g., to account for real-world differences, such as due to manufacturing, between the delay circuitries). In this manner, the multiphase signal generation circuitry 100 may provide a phase difference between $\psi_1$ and $\psi_2$ of half of the quadrature delay or 45°.

Figure 7:
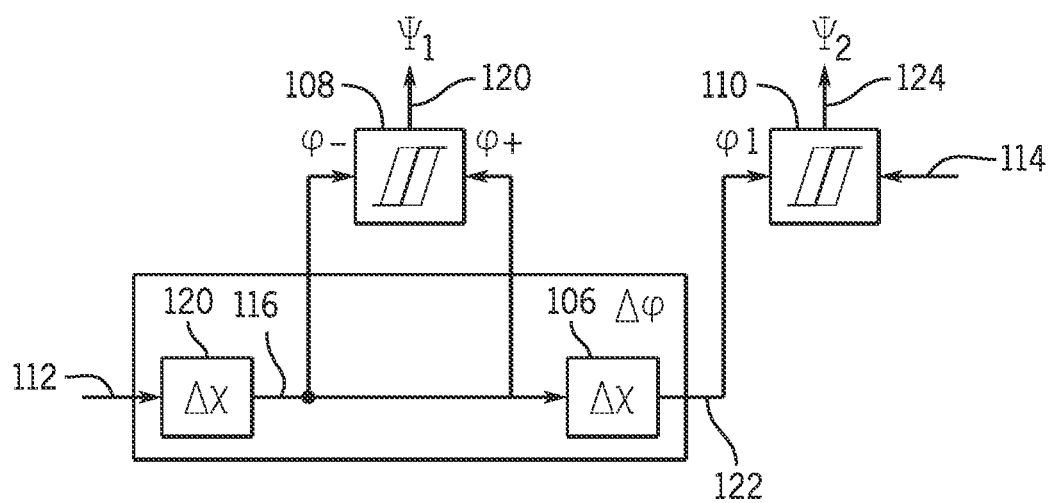
FIG. 7 is a schematic diagram of multiphase signal generation circuitry that has delay elements providing a first delay, but not delay elements providing a second delay, according to embodiments of the present disclosure.

As mentioned above, in some embodiments, the delay element 104 (and/or the dummy load 126) providing the delay may be omitted from the multiphase signal generation circuitry 100 altogether. FIG. 7 is a schematic diagram of multiphase signal generation circuitry 138 that has delay elements 102 and 106 providing the delay Δx, but not delay element 104 providing the delay according to embodiments of the present disclosure. As such, the first interpolator 108 interpolates between two instances of the same signal (e.g., the first input signal 112 delayed by the delay element 102 (providing the delay Δx), and the second interpolator 110 interpolates between the first input signal 112 delayed by the delay elements 102, 106 (each providing the delay Δx) and the second input signal 114. As such, Equations 1 and 2 may be applied to the multiphase signal generation circuitry 138 by replacing the delay with zero. Moreover, while the first interpolator 108 may not interpolate between two different signals (e.g., as it interpolates between two instances of the same signal), because interpolation performed by each interpolator (e.g., including 110) results in some interpolation delay, to ensure that output signals from the interpolators (e.g., $\psi_1$ and $\psi_2$) are aligned in phase or remain synchronized, the first interpolator 108 may apply the same interpolation delay to the output signal $\psi_1$ as the second interpolator 110 applies to the output signal $\psi_2$.

Figure 8:
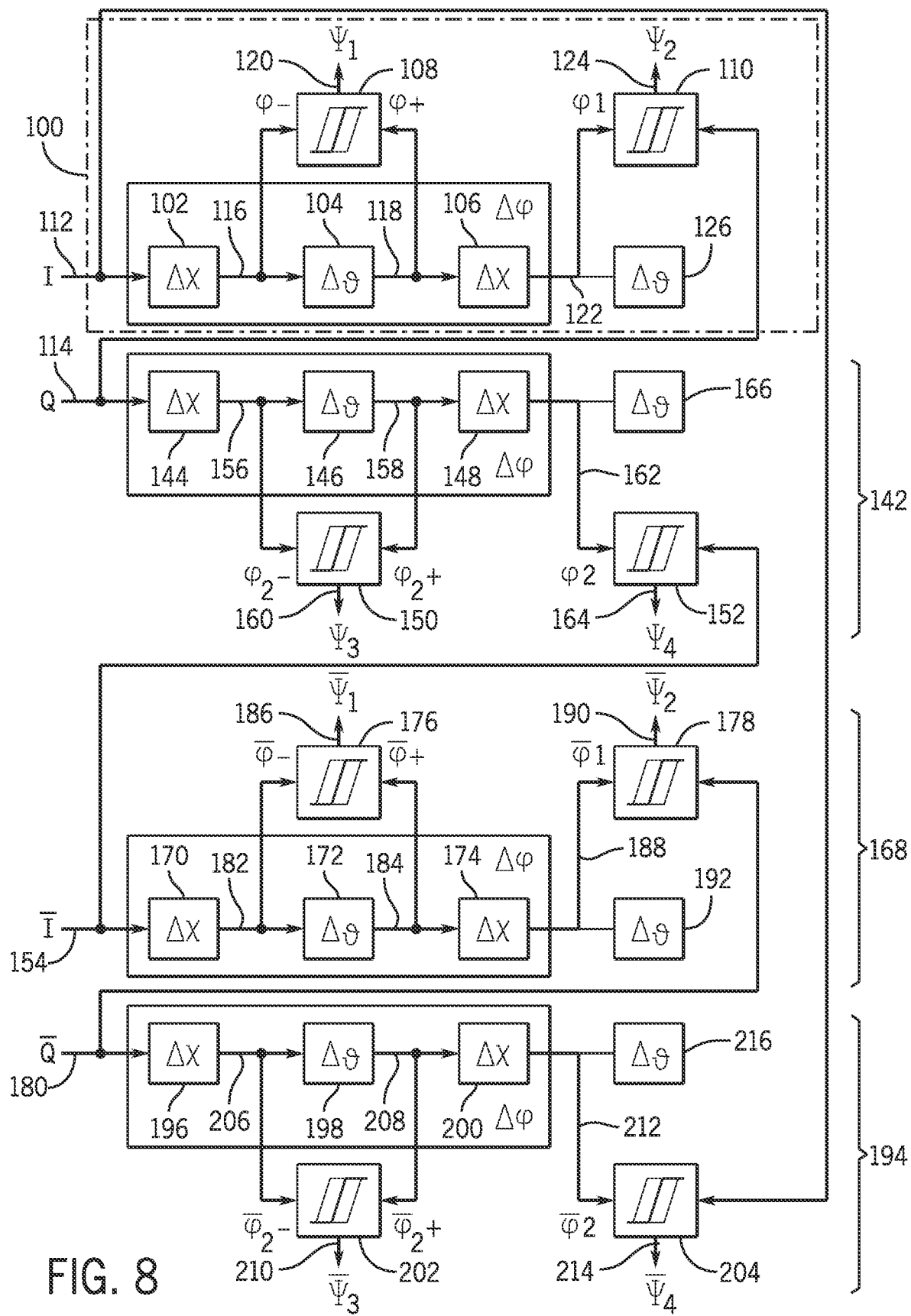
FIG. 8 is a schematic diagram of multiphase signal generation circuitry that may be a part of the transmitter of FIG. 3 and/or the receiver of FIG. 4, receives input local oscillator signals, and generates eight output signals that are out-of-phase with one another by the half of the quadrature delay, according to embodiments of the present disclosure.

FIG. 8 is a schematic diagram of multiphase signal generation circuitry 140 that may be a part of a local oscillator (e.g., 66, 84) of the transmitter 52 and/or the receiver 54, receives input local oscillator signals, and generates eight output signals that are out-of-phase with one another by half of the quadrature delay or 45°, according to embodiments of the present disclosure. As illustrated, the multiphase signal generation circuitry 140 may include a first portion having the multiphase signal generation circuitry 140 of FIG. 5 to generate the first and second output signals 120, 124 that are out-of-phase by 45°. Similarly, the multiphase signal generation circuitry 140 may include a second portion 142 having three delay circuitries 144, 146, 148 and two phase interpolators 150, 152. The delay circuitries 144, 148 (similar to and sharing characteristics with the delay circuitries 102, 106 of the multiphase signal generation circuitry 100) may cause a delay of Δx, while the delay circuitry 146 (similar to and sharing characteristics with the delay circuitries 102, 106 of the multiphase signal generation circuitry 100) may cause a different delay Δϑ.

The phase interpolators 150, 152 (similar to and sharing characteristics with the phase interpolators 108, 110 of the multiphase signal generation circuitry 100) may perform interpolation between two input signals in the phase domain. The second portion 142 of the multiphase signal generation circuitry 140 may receive two input signals 114, 154 that are out-of-phase with one another by the quadrature delay of 90°. As illustrated, the second input signal 114 may include the Q component of a local oscillator signal (e.g., 65, 83) and a third input signal 154 may include an inverted 'I' or component of the local oscillator signal that is offset from the I component (e.g., the first input signal 112) by twice the quadrature delay or 180°. The second input signal 114 is input to fourth delay circuitry 144, which provides a first signal 156 (e.g., having a phase $\varphi_2-$) to a third phase interpolator 150. The output 156 of the fourth delay circuitry 144 is input to fifth delay circuitry 146, which provides a second signal 158 (e.g., having a phase $\varphi_2+$) to the third phase interpolator 150. The third phase interpolator 150 interpolates between the phases $\varphi_2-$ and $\varphi_2+$ to generate a third output signal 160 (e.g., having a phase $\psi_3$ that is halfway between $\varphi_2-$ and $\varphi_2+$). The phases of the first output signal 120 (e.g., $\psi_1$) and the third output signal 160 (e.g., $\psi_3$) are out-of-phase by the quadrature delay of 90°.

The output 158 of the fifth delay circuitry 146 is input to sixth delay circuitry 148, which provides a first signal 162 (e.g., having a phase $\varphi_2$) to a fourth phase interpolator 152. As illustrated, the total phase delay between the second input signal 114 and first signal 162 is Δφ (e.g., Δx+Δϑ+Δx). The fourth phase interpolator 152 also receives the third input signal 154, which is out-of-phase with the second input signal 114 by the quadrature delay of 90°. The fourth phase interpolator 152 then interpolates between the phases $\varphi_2$ and that of the third input signal 154 to generate a fourth output signal 164 (e.g., having a phase $\psi_4$ that is halfway between $\varphi_2$ and that of the third input signal 154). The phases of the third output signal 160 (e.g., $\psi_3$) and the fourth output signal 164 (e.g., $\psi_4$) are out-of-phase by half of the quadrature delay or 45°, and the phases of the first output signal 120 (e.g., $\psi_1$) and the fourth output signal 164 (e.g., $\psi_4$) are out-of-phase by 1.5 times the quadrature delay or 135°. In some embodiments, the second portion 142 of the multiphase signal generation circuitry 140 may include a dummy load 166 having a delay of to facilitate providing a balanced load in the second portion 142 for better performance.

The multiphase signal generation circuitry 140 may also include a third portion 168 having three delay circuitries 170, 172, 174 and two phase interpolators 176, 178. The delay circuitries 170, 174 (similar to and sharing characteristics with the delay circuitries 102, 106 of the multiphase signal generation circuitry 100) may cause a delay of Δx, while the delay circuitry 172 (similar to and sharing characteristics with the delay circuitries 102, 106 of the multiphase signal generation circuitry 100) may cause a different delay Δϑ. The phase interpolators 176, 178 (similar to and sharing characteristics with the phase interpolators 108, 110 of the multiphase signal generation circuitry 100) may perform interpolation between two input signals in the phase domain.

The third portion 168 of the multiphase signal generation circuitry 140 may receive two input signals 154, 180 that are out-of-phase with one another by the quadrature delay of 90°. As illustrated, the third input signal 154 may include the I component of a local oscillator signal (e.g., 65, 83) and a fourth input signal 180 may include an inverted 'Q' or '$\overline{Q}$' component of the local oscillator signal that is offset from the Q component (e.g., the second input signal 114) by 180°. The third input signal 154 is input to seventh delay circuitry 170, which provides a first signal 182 (e.g., having a phase $\overline{\varphi}-$) to a fifth phase interpolator 176. The output 182 of the seventh delay circuitry 170 is input to eighth delay circuitry 172, which provides a second signal 184 (e.g., having a phase $\overline{\varphi}+$) to the fifth phase interpolator 176. The fifth phase interpolator 176 interpolates between the phases $\overline{\varphi}-$ and $\overline{\varphi}+$ to generate a fifth output signal 186 (e.g., having a phase $\overline{\psi}_1$ that is halfway between $\overline{\varphi}-$ and $\overline{\varphi}+$). The phases of the first output signal 120 (e.g., $\psi_1$) and the fifth output signal 186 (e.g., $\overline{\psi}_1$) are 180° out-of-phase, and, as such, the fifth output signal 186 may represent an inversion of the first output signal 120.

The output 184 of the eighth delay circuitry 172 is input to ninth delay circuitry 174, which provides a first signal 188 (e.g., having a phase $\overline{\varphi}_i$) to a sixth phase interpolator 178. As illustrated, the total phase delay between the third input signal 154 and the first signal 188 is Δφ (e.g., Δx+Δϑ+Δx). The sixth phase interpolator 178 also receives the fourth input signal 180, which is out-of-phase with the third input signal 154 by the quadrature delay of 90°. The sixth phase interpolator 178 then interpolates between the phases $\overline{\varphi}_1$ and that of the fourth input signal 180 to generate a sixth output signal 190 (e.g., having a phase $\overline{\psi}_2$ that is halfway between $\overline{\varphi}_1$ and that of the fourth input signal 180). The phases of the fifth output signal 186 (e.g., $\overline{\psi}_1$) and the sixth output signal 190 (e.g., $\overline{\psi}_2$) are out-of-phase by one half of the quadrature delay or 90°, and the phases of the first output signal 120 (e.g., $\psi_i$) and the sixth output signal 190 (e.g., $\overline{\psi}_2$) are out-of-phase by 2.5 times the quadrature delay or 225°. Additionally, the phases of the second output signal 124 (e.g., $\overline{\psi}_2$) and the sixth output signal 190 (e.g., $\overline{\psi}_2$) are out-of-phase by twice the quadrature delay or 180°, and, as such, the sixth output signal 190 may represent an inversion of the second output signal 124. In some embodiments, the third portion 168 of the multiphase signal generation circuitry 140 may include a dummy load 192 having a delay of $\Delta\vartheta$ to facilitate providing a balanced load in the third portion 168 for better performance.

The multiphase signal generation circuitry 140 may further include a fourth portion 194 having three delay circuitries 196, 198, 200 and two phase interpolators 202, 204. The delay circuitries 196, 200 (similar to and sharing characteristics with the delay circuitries 102, 106 of the multiphase signal generation circuitry 100) may cause a delay of $\Delta x$, while the delay circuitry 198 (similar to and sharing characteristics with the delay circuitries 102, 106 of the multiphase signal generation circuitry 100) may cause a different delay $\Delta\vartheta$. The phase interpolators 202, 204 (similar to and sharing characteristics with the phase interpolators 108, 110 of the multiphase signal generation circuitry 100) may perform interpolation between two input signals in the phase domain.

The fourth portion 194 of the multiphase signal generation circuitry 140 may receive two input signals 180, 112 that are out-of-phase with one another by the quadrature delay of 90°. As illustrated, the fourth input signal 180 may include the $\overline{Q}$ component of a local oscillator signal (e.g., 65, 83) and the first input signal 112 may include the I component of the local oscillator signal. The fourth input signal 180 is input to tenth delay circuitry 196, which provides a first signal 206 (e.g., having a phase $\overline{\varphi}_2-$) to a seventh phase interpolator 202. The output 206 of the tenth delay circuitry 196 is input to eleventh delay circuitry 198, which provides a second signal 208 (e.g., having a phase $\overline{\varphi}_2+$) to the seventh phase interpolator 202. The seventh phase interpolator 202 interpolates between the phases $\overline{\varphi}_2-$ and $\overline{\varphi}_2+$ to generate a seventh output signal 210 (e.g., having a phase $\overline{\psi}_3$ that is halfway between $\overline{\varphi}_2-$ and $\overline{\varphi}_2+$). The phases of the first output signal 120 (e.g., $\psi_1$) and the seventh output signal 210 (e.g., $\overline{\psi}_3$) are out-of-phase by three times the quadrature delay or 270°. Additionally, the phases of the third output signal 160 (e.g., $\psi_3$) and the seventh output signal 210 (e.g., $\overline{\psi}_3$) are out-of-phase by twice the quadrature delay or 180°, and, as such, the seventh output signal 210 may represent an inversion of the third output signal 160.

The output 208 of the eleventh delay circuitry 198 is input to twelfth delay circuitry 200, which provides a first signal 212 (e.g., having a phase $\overline{\varphi}_2$) to an eighth phase interpolator 204. As illustrated, the total phase delay between the fourth input signal 180 and the first signal 212 is $\Delta\varphi$ (e.g., $\Delta x+\Delta\vartheta+\Delta x$). The eighth phase interpolator 204 also receives the first input signal 112, which is out-of-phase with the fourth input signal 180 by the quadrature delay of 90°. The eighth phase interpolator 204 then interpolates between the phases $\overline{\varphi}_2$ and that of the first input signal 112 to generate an eighth output signal 214 (e.g., having a phase $\overline{\psi}_4$ that is halfway between $\overline{\varphi}_2$ and that of the first input signal 112). The phases of the seventh output signal 210 (e.g., $\overline{\psi}_3$) and the eighth output signal 214 (e.g., $\overline{\psi}_4$) are out-of-phase by one-half the quadrature delay or 45°, and the phases of the first output signal 120 (e.g., $\psi_1$) and the eighth output signal 214 (e.g., $\overline{\psi}_4$) are out-of-phase 3.5 times the quadrature delay or 315°. In some embodiments, the fourth portion 194 of the multiphase signal generation circuitry 140 may include a dummy load 216 having a delay of $\Delta\vartheta$ to facilitate providing a balanced load in the fourth portion 194 for better performance.

Figure 9:
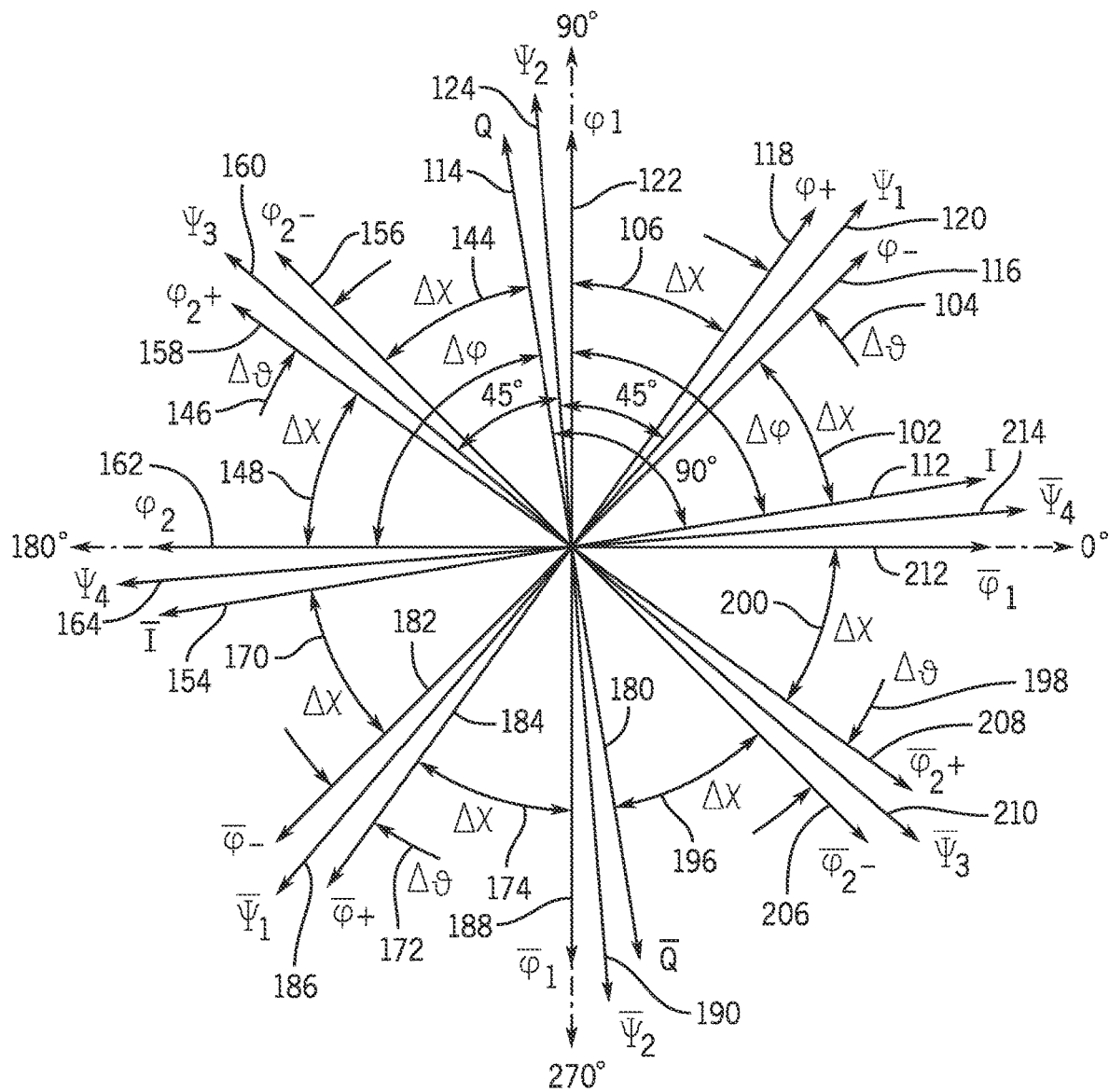
FIG. 9 is a phase plot illustrating the phases associated with and output by the multiphase signal generation circuitry of FIG. 8, according to embodiments of the present disclosure.

FIG. 9 is a phase plot illustrating the phases associated with and output by the multiphase signal generation circuitry 140 of FIG. 8, according to embodiments of the present disclosure. The phase plot includes the phases illustrated in the phase plot of FIG. 6 that are associated with and output by the multiphase signal generation circuitry 100 of FIG. 5, and further includes the phases associated with and output by the second portion 142, third portion 168, and the fourth portion 194. The phase plot may include a positive horizontal axis representing 0°, a positive vertical axis representing 90°, a negative horizontal axis representing 180°, and a negative vertical axis representing 270°. As illustrated, the first input signal 112 may include an I component signal of a local oscillator signal (e.g., 65, 83), the second input signal 114 may include a Q component signal of the local oscillator signal, the third input signal 154 may include an $\overline{I}$ component signal of the local oscillator signal, and a fourth input signal 180 may include a $\overline{Q}$ component signal of the local oscillator signal. As such, the second input signal 114 may be out-of-phase from the first input signal 112 by the quadrature delay of 90°, the third input signal 154 may be out-of-phase from the second input signal 114 by the quadrature delay of 90°, the fourth input signal 180 may be out-of-phase from the third input signal 154 by the quadrature delay of 90°, and the first input signal 112 may be out-of-phase from the fourth input signal 180 by the quadrature delay of 90°.

As explained in FIG. 6, the multiphase signal generation circuitry 100, which may be a first portion of the multiphase signal generation circuitry 140 of FIG. 8, may provide a phase difference of one-half the quadrature delay or 45° between $\psi_1$ and $\psi_2$. Additionally, as explained with respect to FIG. 8, the first signal 156 input to the third phase interpolator 150 may have a phase of $\varphi_2-$ due to being delayed by $\Delta x$ from the fourth delay circuitry 144. The second signal 158 input to the third phase interpolator 150 may have a phase of $\varphi_2+$ due to being delayed by $\Delta x$ from the fourth delay circuitry 144 and by $\Delta\vartheta$ from the fifth delay circuitry 146. The third phase interpolator 150 interpolates between the phases $\varphi_2-$ and $\varphi_2+$ to generate the third output signal 160 having the phase $\psi_3$ that is halfway between $\varphi_2-$ and $\varphi_2+$. As such, the phase $\psi_3$ may be expressed by Equation 3 below:

$$\psi_3 = Q + \Delta x + \frac{\Delta\vartheta}{2} = I + 90^\circ + \Delta x + \frac{\Delta\vartheta}{2} = \psi_1 + 90^\circ \quad \text{(Equation 3)}$$

In this manner, the multiphase signal generation circuitry 140 may provide a phase difference of the quadrature delay of 90° between $\psi_1$ and $\psi_3$.

Also as explained with respect to FIG. 8, the first signal 162 input to the fourth phase interpolator 152 may have a phase of $\varphi_2$ due to being delayed by $\Delta x$ from the fourth delay circuitry 144, $\Delta\vartheta$ from the fifth delay circuitry 146, and $\Delta x$ from the sixth delay circuitry 148. The second signal 154 input to the fourth phase interpolator 152 (e.g., the $\bar{I}$ component signal of the local oscillator signal) may have a phase that is out-of-phase with the second input signal 114 (e.g., the Q component signal of the local oscillator signal) by the quadrature delay of 90°. The fourth phase interpolator 152 interpolates between the phases $\varphi_2$ and that of the third input signal 154 to generate the fourth output signal 164 having the phase $\psi_4$ that is halfway between $\varphi_2$ and that of the third input signal 154. As such, the phase $\psi_4$ may be expressed by Equation 4 below:

$$\psi_4 = \frac{\bar{I}+\varphi_2}{2} = I + \Delta x + \frac{\Delta\vartheta}{2} + 135^\circ = \psi_1 + 135^\circ \quad \text{(Equation 4)}$$

In this manner, the multiphase signal generation circuitry 140 may provide a phase difference of 1.5 times the quadrature delay or 135° between $\psi_1$ and $\psi_4$.

Additionally, the first signal 182 input to the fifth phase interpolator 176 may have a phase of due to being delayed by $\Delta x$ from the seventh delay circuitry 170. The second signal 184 input to the fifth phase interpolator 176 may have a phase of $\overline{\varphi}+$ due to being delayed by $\Delta x$ from the seventh delay circuitry 170 and by $\Delta\vartheta$ from the seventh delay circuitry 172. The fifth phase interpolator 176 interpolates between the phases $\overline{\varphi}-$ and $\overline{\varphi}+$ to generate the fifth output signal 186 having the phase $\overline{\psi}_i$ that is halfway between $\overline{\varphi}-$ and $\overline{\varphi}+$. As such, the phase $\overline{\psi}_1$ may be expressed by Equation 5 below:

$$\overline{\psi}_1 = \bar{I} + \Delta x + \frac{\Delta\vartheta}{2} = I + 180^\circ + \Delta x + \frac{\Delta\vartheta}{2} = \psi_1 + 180^\circ \quad \text{(Equation 5)}$$

In this manner, the multiphase signal generation circuitry 140 may provide a phase difference of twice the quadrature delay or 180° between $\psi_1$ and $\overline{\psi}_1$.

As explained with respect to FIG. 8, the first signal 188 input to the sixth phase interpolator 178 may have a phase of $\overline{\varphi}_1$ due to being delayed by $\Delta x$ from the seventh delay circuitry 170, $\Delta\vartheta$ from the eighth delay circuitry 172, and $\Delta x$ from the ninth delay circuitry 174. The second signal 180 input to the sixth phase interpolator 178 (e.g., the $\overline{Q}$ component signal of the local oscillator signal) may have a phase that is out-of-phase with the third input signal 154 (e.g., the $\bar{I}$ component signal of the local oscillator signal) by the quadrature delay of 90°. The sixth phase interpolator 178 interpolates between the phases $\varphi_i$ and that of the fourth input signal 180 to generate the sixth output signal 190 having the phase $\overline{\psi}_2$ that is halfway between $\overline{\varphi}_1$ and that of the fourth input signal 180. As such, the phase $\overline{\psi}_2$ may be expressed by Equation 6 below:

$$\overline{\psi}_2 = \frac{\overline{Q}+\overline{\varphi}_1}{2} = I + 180^\circ + \Delta x + \frac{\Delta\vartheta}{2} + 45^\circ = \psi_1 + 225^\circ \quad \text{(Equation 6)}$$

In this manner, the multiphase signal generation circuitry 140 may provide a phase difference of 2.5 times the quadrature delay or 225° between $\psi_1$ and $\overline{\psi}_2$.

Moreover, the first signal 206 input to the seventh phase interpolator 202 may have a phase of $\overline{\varphi}_2-$ due to being delayed by $\Delta x$ from the tenth delay circuitry 196. The second signal 208 input to the seventh phase interpolator 202 may have a phase of $\overline{\varphi}_2+$ due to being delayed by $\Delta x$ from the tenth delay circuitry 196 and by $\Delta\vartheta$ from the eleventh delay circuitry 198. The seventh phase interpolator 202 interpolates between the phases $\overline{\varphi}_2-$ and $\overline{\varphi}_2+$ to generate the seventh output signal 210 having the phase $\overline{\psi}_3$ that is halfway between $\overline{\varphi}_2-$ and $\overline{\varphi}_2+$. As such, the phase $\overline{\psi}_3$ may be expressed by Equation 7 below:

$$\overline{\psi}_3 = \overline{Q} + \Delta x + \frac{\Delta\vartheta}{2} = I + 270^\circ + \Delta x + \frac{\Delta\vartheta}{2} = \psi_1 + 270^\circ \quad \text{(Equation 7)}$$

In this manner, the multiphase signal generation circuitry 140 may provide a phase difference of three times the quadrature delay or 270° between $\psi_1$ and $\overline{\psi}_3$.

As explained with respect to FIG. 8, the first signal 212 input to the eighth phase interpolator 204 may have a phase of $\overline{\varphi}_2$ due to being delayed by $\Delta x$ from the tenth delay circuitry 196, $\Delta\vartheta$ from the eleventh delay circuitry 198, and $\Delta x$ from the twelfth delay circuitry 200. The second signal 112 input to the eighth phase interpolator 204 (e.g., the I component signal of the local oscillator signal) may have a phase that is out-of-phase with the fourth input signal 180 (e.g., the $\overline{Q}$ component signal of the local oscillator signal) by the quadrature delay of 90°. The eighth phase interpolator 204 interpolates between the phases $\overline{\varphi}_2$ and that of the first input signal 112 to generate the eighth output signal 214 having the phase $\overline{\psi}_4$ that is halfway between $\overline{\varphi}_2$ and that of the first input signal 112. As such, the phase $\overline{\psi}_4$ may be expressed by Equation 8 below:

$$\overline{\psi}_4 = \frac{I + 360^\circ + \overline{\varphi}_2}{2} = I + \Delta x + \frac{\Delta\vartheta}{2} + 315^\circ = \psi_1 + 315^\circ \quad \text{(Equation 8)}$$

In this manner, the multiphase signal generation circuitry 140 may provide a phase difference of 3.5 times the quadrature delay or 315° between $\psi_1$ and $\overline{\psi}_4$.

As mentioned above, the delays $\Delta x$, $\Delta\vartheta$ may be selected such that phase interpolators perform interpolation between input signals in a linear region of the phase interpolators. The linear region may be a fixed time range that may be determined or estimated during a design phase of each phase interpolator. The linear region may be dependent on the two input signals, and occur where transitions of the signals within phase interpolators, triggered by two input signals (e.g., between low and high values, or vice versa) overlap. As such, the phase range of linearity of a phase interpolator may change with frequency of the input signals. For example, if a linear region of a phase interpolator in time is defined by a maximal time difference between two input signals $w_t$, then the linear region in the phase domain for the phase interpolator is defined by Equation 9 below:

$$w_p = \frac{w_t \times 360^\circ}{T} \quad \text{(Equation 9)}$$

where $w_p$ is the maximal time difference and T is a period of the two input signals (e.g., 1/frequency).

Figure 10:
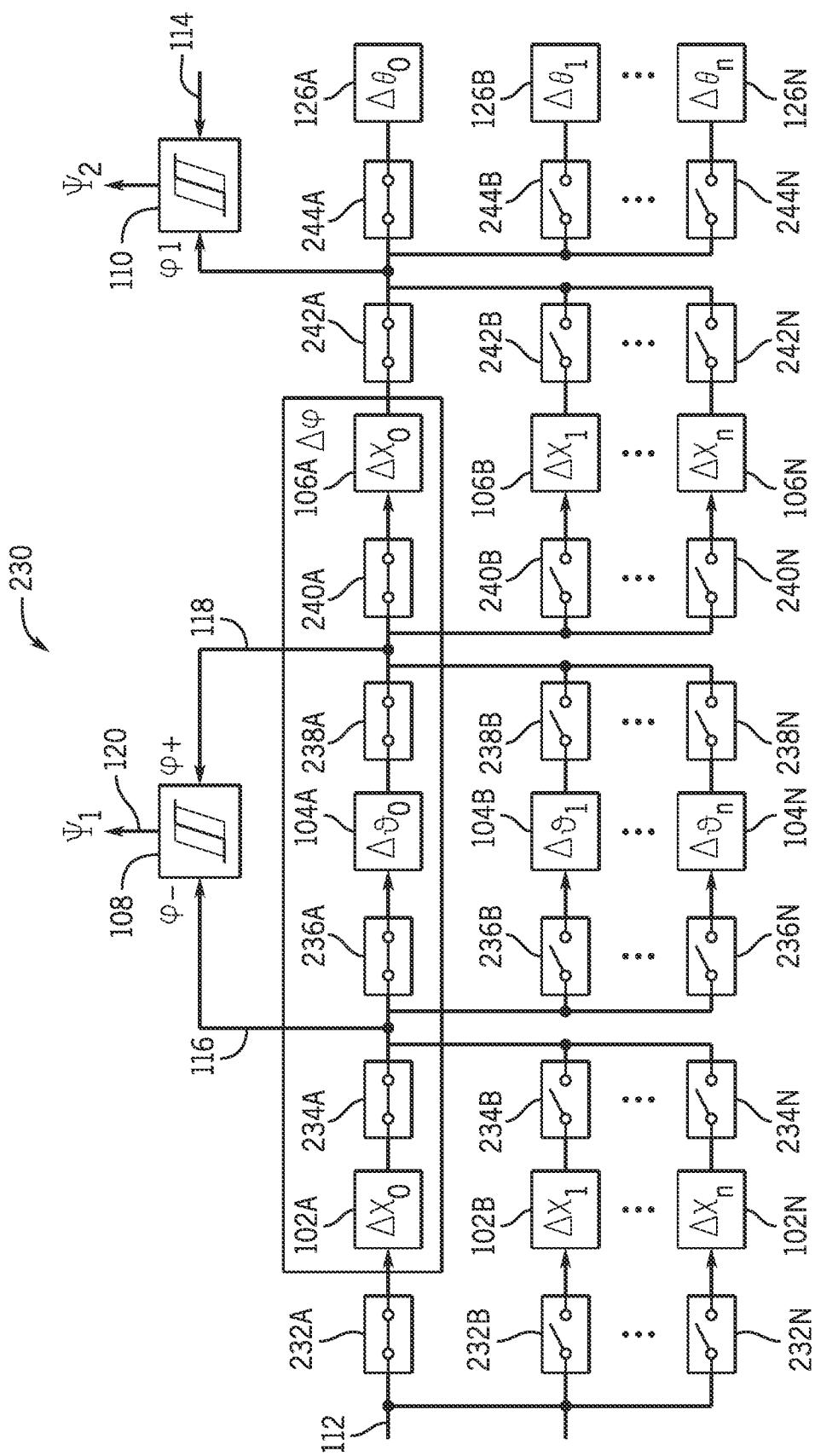
FIG. 10 is a schematic diagram of multiphase signal generation circuitry having strings of multiple delay circuitries, according to embodiments of the present disclosure.

In some embodiments, to ensure that the phase interpolators operate in their respective linear regions, the processor 12 and/or the multiphase signal generation circuitry 140 may select a delay (e.g., $\Delta x$ or $\Delta\vartheta$) provided by each delay circuitry. As such, the delay circuitries may provide variable delays, through variable delay circuitries, a string of delay circuitries, or both. FIG. 10 is a schematic diagram of multiphase signal generation circuitry 230 having strings of multiple delay circuitries, according to embodiments of the present disclosure. In particular, the multiphase signal generation circuitry 230 illustrates the multiphase signal generation circuitry 100 of FIG. 5 having the strings of multiple delay circuitries. As illustrated, the processor 12 and/or the multiphase signal generation circuitry 230 may select one first delay circuitry from multiple delay circuitries 102A-n, each providing a different respective delay $\Delta x_0$-$\Delta x_n$, using switches 232A-n and 234A-n. Similarly, the processor 12 and/or the multiphase signal generation circuitry 230 may select one second delay circuitry from multiple delay circuitries 104A-n, each providing a different respective delay $\Delta\vartheta_0$-$\Delta\vartheta_n$, using switches 236A-n and 238A-n. The processor 12 and/or the multiphase signal generation circuitry 230 may also select one third delay circuitry from multiple delay circuitries 106A-n (e.g., to match the first delay circuitry from multiple delay circuitries 102A-n), each providing a different respective delay $\Delta x_0$-$\Delta x_n$, using switches 240A-n and 242A-n. In embodiments having dummy loads, the processor 12 and/or the multiphase signal generation circuitry 230 may select a dummy load from multiple dummy load 126A-n, each providing a different respective delay $\Delta\vartheta_0$-$\Delta\vartheta_n$, using switches 244A-n. As noted above, the delay circuitries 102A-n, 104A-n, 106A-n, and/or the dummy loads 126A-n may provide any suitable phase (or time) delay between 0° and 360° (e.g., approximately 32.1°, 56.7°, 80.0°, 129°, 278°, and so on).

Figure 11:
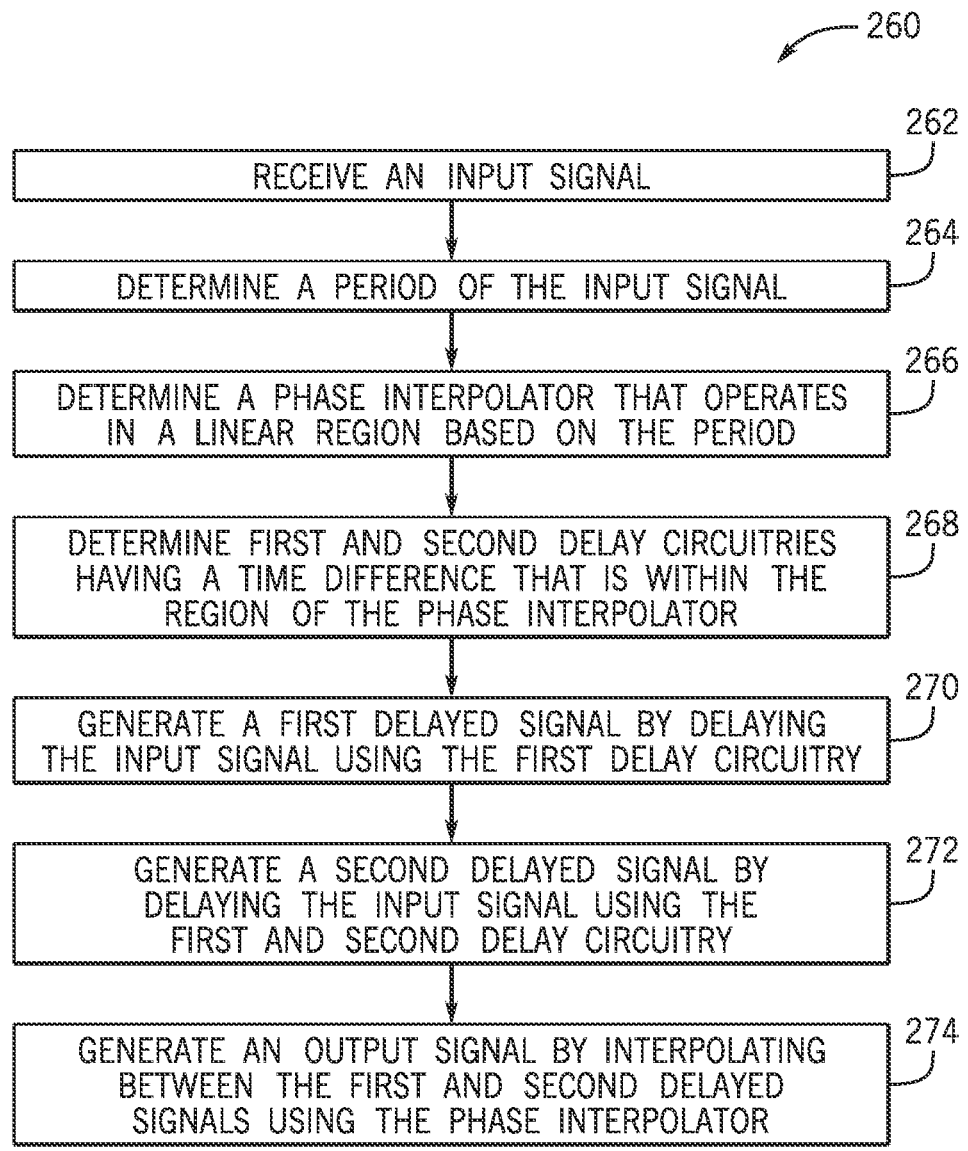
FIG. 11 is a flowchart of a method for selecting delay circuitries to generate multiple phases of a local oscillator signal, according to embodiments of the present disclosure.

FIG. 11 is a flowchart of a method 260 for selecting delay circuitries to generate multiple phases of a local oscillator signal, according to embodiments of the present disclosure. Any suitable device (e.g., a controller) that may control components of the electronic device 10, such as the processor 12, may perform the method 260. In some embodiments, the method 260 may be implemented by executing instructions stored in a tangible, non-transitory, computer-readable medium, such as the memory 14 or storage 16, using the processor 12. For example, the method 260 may be performed at least in part by one or more software components, such as an operating system of the electronic device 10, one or more software applications of the electronic device 10, and the like. While the method 260 is described using steps in a specific sequence, it should be understood that the present disclosure contemplates that the described steps may be performed in different sequences than the sequence illustrated, and certain described steps may be skipped or not performed altogether. It should be understood that using the processor 12 to calculate delays and/or select delay elements, as described in the method 260, is merely an example. In additional or alternative embodiments, selecting the delay circuitries may be performed with analog circuitry (e.g., any of the above-mentioned delay circuitries providing the delays $\Delta x$, $\Delta\vartheta$) without calculating delays, such as by using signal/edge comparators (e.g., of the delay circuitries) to detect an order of signals/edges that arrive to the comparators, which may determine whether linear regions of phase interpolators are exceeded.

In process block 262, the processor 12 receives an input signal. For example, the multiphase signal generation circuitry 230 of FIG. 10 may receive the I component 112 of a local oscillator signal (e.g., 65, 83). In process block 264, the processor 12 determines a period of the input signal. It should be understood that the processor 12 may determine a frequency of the input signal, and determine a period (e.g., 1/frequency) of the input signal because a linear region of the phase interpolators may be expressed in the time domain.

In process block 266, the processor 12 determines or selects a phase interpolator that operates in a linear region based on the period of the input signal. As discussed above, the processor 12 may use Equation 9 to determine whether the period of the input signal is with the linear region of the phase interpolator. In process block 268, the processor 12 determines first and second delay circuitries having a time difference that is within the linear region of the phase interpolator. Again, it should be understood that the processor 12 may determine a phase difference of the first and second delay circuitries, and determine a time difference (e.g., 1/phase difference) based on the phase difference because the linear region of the phase interpolators may be expressed in the time domain. The processor 12 may determine the first and second delay circuitries using Equation 10 below, which expresses the respective delays in the phase domain:

$$0 \leq 90° - 2\Delta x - \Delta\vartheta \leq w_p \quad \text{(Equation 10)}$$

Equation 11 below illustrates this expression in the time domain:

$$0 \leq \frac{T}{4} - 2\Delta x_t - \Delta\vartheta_t \leq w_t \quad \text{(Equation 11)}$$

which can be further expressed in as:

$$\frac{T}{8} - \frac{\Delta\vartheta_t}{2} - \frac{w_t}{2} \leq \Delta x_t \leq \frac{T}{8} - \frac{\Delta\vartheta_t}{2} \quad \text{(Equation 12)}$$

As such, the processor 12 may determine or select the delay circuitries providing delays $\Delta x_t$ (which represents the delay $\Delta x$ in the time domain) and/or $\Delta\vartheta_t$ (which represents the delay $\Delta\vartheta$ in the time domain) to ensure that the phase interpolator operates in its linear region based on the frequency of the input signal. For example, referring back to FIG. 10, the processor 12 may select delay circuitry 102A (e.g., by closing switches 232A, 234A and opening switches 232B-n, 234B-n) and delay circuitry 106A (e.g., by closing switches 240A, 242A and opening switches 240B-n, 242B-n) to provide delay $\Delta x_0$, and select delay circuitry 104A (e.g., by closing switches 236A, 238A and opening switches 236B-n, 238B-n) to provide delay $\Delta\vartheta_0$.

In some cases, one of the delay circuitries (e.g., that provide the delay $\Delta x$ or that provide the delay $\Delta\vartheta$) may vary, while the other delay circuitry remains fixed, as it is the sum of phases or times of the delays (e.g., $\Delta x + \Delta\vartheta$) that determines selection of the delay circuitries. That is, there may be delay circuitry strings (having delay circuitries 102A-n and 106A-n) providing delays $\Delta x_{0-n}$, while there may be a fixed delay circuitry 104 providing a delay (e.g., no delay circuitry string as shown in the multiphase signal generation circuitry 100 of FIG. 5). Similarly, the delay circuitries 102 and 106 may be fixed (e.g., providing a delay $\Delta x$ as shown in the multiphase signal generation circuitry 100 of FIG. 5), while there may be a delay circuitry string (having delay circuitries 104A-n) providing delays $\Delta\vartheta_{0-n}$.

Returning back to FIG. 11, in process block 270, the processor 12 generates a first delayed signal by delaying the input signal using the first delay circuitry. Referring back to FIG. 10, for example, the first delayed signal 116 having a phase of φ− is generated by delaying the input signal 112 using the first delay circuitry 102A. In process block 272, the processor 12 generates a second delayed signal by delaying the input signal using the first and second delay circuitries.

Referring back to FIG. 10, for example, the second delayed signal 118 having a phase of φ+ is generated by delaying the input signal 112 using the first delay circuitry 102A and the second delay circuitry 102B. In process block 274, the processor 12 generates an output signal by interpolating between the first and second delayed signals using the phase interpolator. Referring back to FIG. 10, for example, the phase interpolator 108 interpolates between the first and second delayed signals 116, 118 to generate the output signal 120 having a phase of $\psi_1$ that is halfway between φ− and φ+. In this manner, the method 260 enables the processor 12 and/or the multiphase signal generation circuitry 230 to select delay circuitries to generate multiple phases of a local oscillator signal.

As previously mentioned, it should be understood that using the processor 12 to calculate delays and/or select delay elements, as described in the method 260, is merely an example. In additional or alternative embodiments, selecting the delay elements may be performed with analog circuitry (e.g., the delay elements) without calculating delays, such as by using signal/edge comparators and detecting the order of signals/edges that arrive to the comparator, which may determine whether the linear region of a phase interpolator is exceeded. In particular, any of the delay circuitries may include one or more comparators that select any of the delay circuitries. That is, a first delay circuitry, a second delay circuitry, and/or a third delay circuitry may use one or more comparators, configured to select the first, the second and the third delay circuitry that select only the first delay circuitry, only the second delay circuitry, only the third delay circuitry, or any combination of the first, second and third delay circuitries. For example, an in-phase or 'I' component of a signal (e.g., a local oscillator signal) delayed by a sum of different delays (e.g., made up of any combination of Δx and/or Δϑ delays, such as Δx+Δϑ+Δx) may be compared with a quadrature or 'Q' component of the signal, until an order of arrival of the signals (e.g., the delayed I component and the Q component) would change. Then, a set of delays (e.g., Δx+Δϑ+Δx) may be selected based on the change of order of arrival.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. Phase generation circuitry, comprising:
   a first phase interpolator configured to receive at least a first input signal that is delayed by first delay circuitry, and output a first output signal; and
   a second phase interpolator configured to receive the first input signal that is delayed by at least the first delay circuitry and second delay circuitry, receive a second input signal with a phase difference of a quadrature delay compared to the first input signal, and output a second output signal, the first output signal and the second output signal having a phase difference of half of the quadrature delay.

2. The phase generation circuitry of claim 1, wherein the first input signal, the second input signal, the first output signal, and the second output signal each have a same frequency.

3. The phase generation circuitry of claim 1, wherein the first delay circuitry and the second delay circuitry are configured to provide a delay of less than the half of the quadrature delay.

4. The phase generation circuitry of claim 1, wherein the first phase interpolator is configured to interpolate between two instances of the first input signal that is delayed by the first delay circuitry.

5. The phase generation circuitry of claim 1, wherein the first phase interpolator is configured to receive the first input signal that is delayed by the first delay circuitry and a third delay circuitry.

6. The phase generation circuitry of claim 5, wherein the third delay circuitry is configured to provide a delay of less than the quadrature delay.

7. The phase generation circuitry of claim 5, wherein the first delay circuitry and the second delay circuitry are configured to provide a first delay, and the third delay circuitry is configured to provide a second delay different from the first delay.

8. The phase generation circuitry of claim 5, wherein the first delay circuitry, the second delay circuitry, and the third delay circuitry are configured to provide a same delay.

9. The phase generation circuitry of claim 5, wherein the first output signal comprises a phase that is halfway between a phase of the first input signal that is delayed by the first delay circuitry and a phase of the first input signal that is delayed by the first delay circuitry and the third delay circuitry.

10. The phase generation circuitry of claim 1, wherein the second output signal comprises a phase that is halfway between a phase of the first input signal that is delayed by at least the first delay circuitry and the second delay circuitry, and a phase of the second input signal.

11. Multiphase generation circuitry, comprising:
    a first portion comprising first delay circuitry coupled to second delay circuitry coupled to third delay circuitry, a first interpolator coupled to the first delay circuitry and the second delay circuitry, and a second interpolator coupled to the third delay circuitry;
    a second portion comprising fourth delay circuitry coupled to fifth delay circuitry coupled to sixth delay circuitry, a third interpolator coupled to the fourth delay circuitry and the fifth delay circuitry, and a fourth interpolator coupled to the sixth delay circuitry, the second interpolator of the first portion coupled to the second portion;

a third portion comprising seventh delay circuitry coupled to eighth delay circuitry coupled to ninth delay circuitry, a fifth interpolator coupled to the seventh delay circuitry and the eighth delay circuitry, and a sixth interpolator coupled to the ninth delay circuitry, the fourth interpolator of the second portion coupled to the third portion; and a fourth portion comprising tenth delay circuitry coupled to eleventh delay circuitry coupled to twelfth delay circuitry, a seventh interpolator coupled to the tenth delay circuitry and the eleventh delay circuitry, and an eighth interpolator coupled to the twelfth delay circuitry, the sixth interpolator of the third portion coupled to the fourth portion.

12. The multiphase generation circuitry of claim 11, wherein the eighth interpolator of the fourth portion is coupled to the first portion.

13. The multiphase generation circuitry of claim 11, wherein the first portion is configured to receive a first input signal and a second input signal that has a phase difference of a quadrature delay with the first input signal.

14. The multiphase generation circuitry of claim 13, wherein the second portion is configured to receive the second input signal and a third input signal that has a phase difference of twice the quadrature delay with the first input signal.

15. The multiphase generation circuitry of claim 14, wherein the third portion is configured to receive the third input signal and a fourth input signal that has a phase difference of three times the quadrature delay with the first input signal.

16. The multiphase generation circuitry of claim 15, wherein the fourth portion is configured to receive the fourth input signal and the first input signal.

17. An electronic device, comprising:
one or more antennas; and
a transceiver communicatively coupled to the one or more antennas, the transceiver comprising multiphase generation circuitry having first delay circuitry coupled to second delay circuitry coupled to third delay circuitry, first phase interpolation circuitry coupled to the first delay circuitry and the second delay circuitry, and second phase interpolation circuitry coupled to the third delay circuitry, the first delay circuitry configured to receive a first input signal, the first phase interpolation circuitry configured to generate a first output signal, the second phase interpolation circuitry configured to receive a second input signal and generate a second output signal, the first input signal and the second input signal having a phase difference of a quadrature delay, and the first output signal and the second output signal having a phase difference of half of the quadrature delay.

18. The electronic device of claim 17, comprising a local oscillator configured to generate a local oscillator signal, the first input signal comprising an in-phase component of the local oscillator signal, and the second input signal comprising a quadrature component of the local oscillator signal.

19. The electronic device of claim 17, comprising one or more processors, wherein the one or more processors are configured to select the first delay circuitry from a first plurality of delay circuitries, the second delay circuitry from a second plurality of delay circuitries, and the third delay circuitry from a from a third plurality of delay circuitries, each of the first plurality of delay circuitries, the second plurality of delay circuitries, and the third plurality of delay circuitries providing a plurality of delays.

20. The electronic device of claim 17, wherein the first delay circuitry, the second delay circuitry, the third delay circuitry, or any combination thereof, comprises a comparator configured to select the first delay circuitry from a first plurality of delay circuitries, the second delay circuitry from a second plurality of delay circuitries, the third delay circuitry from a third plurality of delay circuitries, or any combination thereof.

21. The electronic device of claim 17, wherein the multiphase generation circuitry comprises a plurality of phase interpolation circuitries, the plurality of phase interpolation circuitries consisting of the first phase interpolation circuitry and the second phase interpolation circuitry.

* * * * *

UNITED STATES PATENT AND TRADEMARK OFFICE
CERTIFICATE OF CORRECTION

PATENT NO.         : 11,570,033 B1
APPLICATION NO.    : 17/404930
DATED              : January 31, 2023
INVENTOR(S)        : Damir Hamidovic, Harald Pretl and Peter Leopold Preyler It is certified that error appears in the above-identified patent and that said Letters Patent is hereby corrected as shown below:

In the Claims

Column 24, Line 23, Claim 19, delete the second occurrence of "from a".

Signed and Sealed this
Ninth Day of April, 2024

Katherine Kelly Vidal
*Director of the United States Patent and Trademark Office*